United States Patent
Hirata et al.

(10) Patent No.: US 11,999,615 B2
(45) Date of Patent: Jun. 4, 2024

(54) NITRIDE PIEZOELECTRIC BODY AND MEMS DEVICE USING SAME

(71) Applicant: NATIONAL INSTITUTE OF ADVANCED INDUSTRIAL SCIENCE AND TECHNOLOGY, Tokyo (JP)

(72) Inventors: Kenji Hirata, Tosu (JP); Hiroshi Yamada, Tosu (JP); Masato Uehara, Tosu (JP); Sri Ayu Anggraini, Tosu (JP); Morito Akiyama, Tosu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 595 days.

(21) Appl. No.: 17/415,691

(22) PCT Filed: Dec. 27, 2019

(86) PCT No.: PCT/JP2019/051419
§ 371 (c)(1),
(2) Date: Jun. 17, 2021

(87) PCT Pub. No.: WO2020/170610
PCT Pub. Date: Aug. 27, 2020

(65) Prior Publication Data
US 2022/0073348 A1   Mar. 10, 2022

(30) Foreign Application Priority Data

Feb. 22, 2019 (JP) ................. 2019-030057

(51) Int. Cl.
*C01B 21/06* (2006.01)
*H10N 30/20* (2023.01)
*H10N 30/85* (2023.01)

(52) U.S. Cl.
CPC ......... *C01B 21/0602* (2013.01); *H10N 30/20* (2023.02); *H10N 30/85* (2023.02)

(58) Field of Classification Search
CPC ..... C01B 21/0602; H10N 30/20; H10N 30/85
See application file for complete search history.

(56) References Cited

U.S. PATENT DOCUMENTS

| 9,374,060 B2 * | 6/2016 | Onda | H03H 9/174 |
| 2004/0135144 A1 * | 7/2004 | Yamada | H03H 9/564 |
| | | | 257/59 |

(Continued)

FOREIGN PATENT DOCUMENTS

| EP | 3896029 A1 | 10/2021 |
| EP | 3974376 A1 | 3/2022 |

(Continued)

OTHER PUBLICATIONS

Jehara, M. et al., "Giant increase in piezoelectric coefficient of AlN by Mg—Nb simultaneous addition and multiple chemical states of Nb," Applied Physics Letters, vol. 111, No. 11, Sep. 11, 2011, 5 pages.

(Continued)

*Primary Examiner* — J. San Martin
(74) *Attorney, Agent, or Firm* — McCoy Russell LLP

(57) ABSTRACT

An object is to provide a piezoelectric body having a value indicating a higher performance index ($d_{33}$, $e_{33}$, $C_{33}$, $g_{33}$, and/or $k^2$) than aluminum nitride not doped with any element. The piezoelectric body is represented by a chemical formula $Al_{1-X-Y}Mg_XM_YN$ where $X+Y$ is less than 1, $X$ is in a range of more than 0 and less than 1, and $Y$ is in a range of more than 0 and less than 1.

8 Claims, 12 Drawing Sheets

(56) References Cited

U.S. PATENT DOCUMENTS

| | | | |
|---|---|---|---|
| 2013/0241673 A1 | 9/2013 | Yokoyama et al. | |
| 2019/0013458 A1* | 1/2019 | Hill et al. | |
| 2022/0085275 A1* | 3/2022 | Haymore | H10N 30/079 |
| 2022/0182034 A1* | 6/2022 | Moe | H03H 9/02015 |
| 2022/0320417 A1* | 10/2022 | Sangle | H10N 30/853 |

FOREIGN PATENT DOCUMENTS

| | | |
|---|---|---|
| JP | 2006124268 A | 5/2006 |
| JP | 2009010926 A | 1/2009 |
| JP | 2013148562 A | 8/2013 |
| JP | 2015233042 A | 12/2015 |
| WO | 2016111280 A1 | 7/2016 |

OTHER PUBLICATIONS

ISA Japan Patent Office, International Search Report Issued in Application No. PCT/JP2019/051419, Mar. 17, 2020, WIPO, 4 pages.

\* cited by examiner

NITRIDE PIEZOELECTRIC BODY AND MEMS DEVICE USING SAME

CROSS REFERENCE TO RELATED APPLICATIONS

The present application is a U.S. National Phase of International Application No. PCT/JP2019/051419, entitled "NITRIDE PIEZOELECTRIC BODY AND MEMS DEVICE USING SAME", and filed on Dec. 27, 2019. International Application No. PCT/JP2019/051419 claims priority to Japanese Patent Application No. 2019-030057, filed on Feb. 22, 2019. The entire contents of each of the above-listed applications are hereby incorporated by reference for all purposes.

TECHNICAL FIELD

The present invention relates to a piezoelectric body of aluminum nitride doped with magnesium and a specific element together and a MEMS device using the same.

BACKGROUND ART

Devices utilizing the piezoelectric phenomenon are used in various fields. For examples, the devices have been increasingly used in portable devices, such as cellular phones, which are strongly desired to be made smaller in size and minimize power consumption. Examples of the devices may include a filter using a film bulk acoustic resonator (FBAR) called an FBAR filter.

The FBAR filter is a filter based on a resonator that utilizes a thickness-longitudinal vibration mode of a thin film exhibiting a piezoelectric response and can resonate in gigahertz band. This kind of FBAR filter with such characteristics has a low loss and can be operated in a wide band. Thus, the FBAR filter is expected to further contribute to the operation at high frequencies and the reduction in size and power consumption of portable devices.

Examples of a piezoelectric material of such a piezoelectric thin film used for FBAR may include scandium-doped aluminum nitride (see Patent Literature 1) and aluminum nitride doped with inexpensive magnesium and niobium (see Non-Patent Literature 1). In particular, scandium-doped aluminum nitride has a high piezoelectric charge constant, so it is expected to be used in a next generation of high frequency filters. Further, scandium-doped aluminum nitride is expected to be used in physical sensors such as pressure sensors, acceleration sensors, and gyro sensors, and various MEMS devices such as actuators.

CITATION LIST

Patent Literature

Patent Literature 1: Japanese Patent Application Laid-Open No. 2009-10926

Non-Patent Literature

Non-Patent Literature 1: M. Uehara, H. Shigemoto, Y. Fujio, t. Nagase, Y. Aida, K. Umeda and M. Akiyama, Appl. Phys. Lett. 111, 112901 (2017)

SUMMARY OF INVENTION

Technical Problem

However, since scandium (Sc) is an expensive rare earth element, there has been a problem in which the production cost of the piezoelectric bodies constituted by scandium-doped aluminum nitride (AlN) is higher than piezoelectric bodies constituted by other substances.

Further, the present inventor has found that doping an element such as Sc to aluminum nitride improves properties such as piezoelectric charge constant. The inventor has also found that higher concentrations of the elements to be doped tends to further increase the piezoelectric charge constant and other properties. However, the upper limit value of the concentration of a single element that can be doped in aluminum nitride is low. Thus, the piezoelectric bodies having the high piezoelectric charge constant and other properties cannot be produced as they are.

Further, the performance of the piezoelectric body used in a MEMS device needs to be evaluated against the performance index of each type of MEMS device. In particular, when piezoelectric bodies are used as actuators or sensors, piezoelectric charge constants such as the level of strain caused by applying a voltage, i.e. $d_{33}$, and the voltage caused by applying a pressure, i.e. $g_{33}$, need to be evaluated. Further, $k^2$, or the conversion efficiency between electric energy and mechanical energy, also provides an important performance index. However, there is a problem in which no other kinds of aluminum nitride, including the one described in Non-Patent Literature 1, show performance indices equal or better than that of the aluminum nitride doped with scandium.

Further, calculation of the piezoelectric charge constant $d_{33}$ requires obtaining the following: the stress $e_{33}$ generated by applying an electric field to the piezoelectric body that is restrained so as not to be distorted; and the proportional constant $C_{33}$ of distortion generated by applying a stress to the piezoelectric body. Further, calculation of the piezoelectric voltage constant $g_{33}$ and the electromechanical coupling constant $k^2$ requires the dielectric constant $\varepsilon_{33}$ of the piezoelectric body in addition to the values for the aforementioned physical properties. A general piezoelectric thin film has a wurtzite crystal structure that is oriented in the c-axis direction, emphasizing the importance of the c-axis component of the piezoelectric performance index.

Thus, under the aforementioned circumstances, an object of the present invention is to provide a nitride piezoelectric body having a value indicating a higher performance index (at least any one of $d_{33}$, $e_{33}$, $C_{33}$, $g_{33}$, and $k^2$) than aluminum nitride not doped with any element, and a MEMS device using the nitride piezoelectric body.

The term "higher performance index" described herein does not mean a larger numerical value of the performance index, but a superior performance index.

Solution to Problem

As a result of persistent intensive studies on the aforementioned problems, the inventor of the present invention has found that adding (doping) a specific element (a substituent element M) together with magnesium (Mg) to aluminum nitride (AlN) makes it possible to produce aluminum nitride having a value indicating a high performance index, thereby discovering the following innovative piezoelectric body.

A first aspect of the present invention for solving the aforementioned problems is a piezoelectric body represented by a chemical formula $Al_{1-X-Y}Mg_X M_Y N$ where X+Y is less than 1, X is in a range of more than 0 and less than 1, and Y is in a range of more than 0 and less than 1. In the chemical formula, M represents any one of Cr, Mn, Fe, Co, Ni, Mo, Tc, Ru, Rh, Pd, Ag, W, Re, Os, Ir, Pt, and Au.

In this first aspect, the piezoelectric body can have a value indicating a higher performance index (at least any one of $d_{33}$, $e_{33}$, $C_{33}$, $g_{33}$, and $k^2$) than aluminum nitride doped with scandium at the same concentration as that of the doped elements (magnesium and the substituent element M).

A second aspect of the present invention is the piezoelectric body described in the first aspect, wherein X+Y is 0.65 or less, X is in a range of more than 0 and less than 0.65, and Y is in a range of more than 0 and less than 0.65.

In this second aspect, the piezoelectric body can have a value indicating the higher performance index (at least any one of $d_{33}$, $e_{33}$, $C_{33}$, $g_{33}$, and $k^2$) than the aluminum nitride doped with scandium at the same concentration as that of the doped elements (magnesium and the substituent element M).

A third aspect of the present invention is the piezoelectric body described in the first aspect, wherein X+Y is 0.375 or less, X is in a range of more than 0 and 0.1875 or less, and Y is in a range of more than 0 and 0.1875 or less.

In this third aspect, the piezoelectric body can have a value indicating the higher performance index (at least any one of $d_{33}$, $e_{33}$, $C_{33}$, $g_{33}$, and $k^2$) than the aluminum nitride doped with scandium at the same concentration as that of the doped elements (magnesium and the substituent element M).

A fourth aspect of the present invention is the piezoelectric body described in the first aspect, wherein X+Y is 0.125 or less, X is in a range of more than 0 and 0.0625 or less, and Y is in a range of more than 0 and 0.0625 or less.

In this fourth aspect, the piezoelectric body can have a value indicating the higher performance index (at least any one of $d_{33}$, $e_{33}$, $C_{33}$, $g_{33}$, and $k^2$) than the aluminum nitride doped with scandium at the same concentration as that of the doped elements (magnesium and the substituent element M).

A fifth aspect of the present invention is the piezoelectric body described in any one of the first to fourth aspects, wherein M is any one of Cr, Mn, Fe, Co, Ni, Mo, Tc, Ru, Rh, Pd, Ag, W, Os, Ir, Pt, and Au.

In this fifth aspect, the piezoelectric body can have a value indicating the further higher performance index (at least any one of $d_{33}$, $e_{33}$, $C_{33}$, $g_{33}$, and $k^2$) than the aluminum nitride doped with scandium at the same concentration as that of the doped elements (magnesium and the substituent element M).

A sixth aspect of the present invention is the piezoelectric body described in any one of the first to fourth aspects, wherein M is Cr or Mn.

In this sixth aspect, the piezoelectric body has a further lower mixing enthalpy and is more readily produced than $Al_{1-X}Sc_XN$ doped with scandium at the same concentration X (mol %) as the concentration (mol %) of the doped elements (magnesium and the substituent element M). Further, the aluminum nitride doped with the elements (magnesium and the substituent element M) has the lower mixing enthalpy than the aluminum nitride doped with scandium at the same concentration, making it possible to have a higher solid solution concentration of the elements (magnesium and the substituent element M) than for scandium. This allows for the provision of a piezoelectric body with a higher performance index than existing ones.

A seventh aspect of the present invention is a MEMS device using the piezoelectric body described in any one of the first to sixth aspects.

The "MEMS device" used herein is not particularly limited as long as it is a micro electromechanical system, and examples thereof may include physical sensors such as pressure sensors, acceleration sensors, and gyro sensors, actuators, microphones, fingerprint authentication sensors, and vibration power generators.

In this seventh aspect, these piezoelectric bodies having high values of the piezoelectric charge constant $d_{33}$ have lower losses and are operatable in a wider band. Thus, using these piezoelectric bodies makes it possible to provide the MEMS device which can further contribute to the operation at high frequencies and the reduction in size and power consumption of portable devices.

BRIEF DESCRIPTION OF DRAWINGS

FIG. 3 is a graph showing the relation between non-doped AlN, AlN doped with only Sc, and each kind of doped AlN, and the lattice constant ratio c/a.

DESCRIPTION OF EMBODIMENTS

Hereinafter, embodiments of piezoelectric bodies according to the present invention will be described with reference to the accompanying drawings. Note that the present invention is not limited to the following embodiments.

First Embodiment

First, a description will be given of a simulation performed by the inventor using aluminum nitride constituted by only aluminum (Al) and nitrogen (N) (non-doped AlN). The simulation was performed by using a software known as VASP (Vienna Ab initio Simulation Package) in which a calculation method referred to as "first principle calculation" was employed. The first principle calculation described herein is a general term for an electronic state calculating method without using a fitting parameter or the like and a method capable of calculating an electronic state by using only the atomic number and a coordinate of each atom constituting a unit lattice, a molecule, or the like.

In the simulation of the present embodiment, a supercell of the non-doped AlN having a wurtzite crystal structure was used for the simulation. The supercell containing sixteen aluminum atoms and sixteen nitrogen atoms was obtained by doubling a unit lattice containing two aluminum atoms and two nitrogen atoms in the a-axis, b-axis, and c-axis directions. Then, the first principle calculation was performed to this AlN having the wurtzite crystal structure by simultaneously changing the atomic coordinate, the cell volume, and the cell shape, thereby calculating the electronic state of the non-doped AlN in a stable structure.

Table 1 shows values (calculated values) of the lattice constant in the a-axis direction, the lattice constant in the c-axis direction, and a ratio (c/a) of the lattice constant in the c-axis direction with respect to the lattice constant in the a-axis direction, calculated from the electronic state of the AlN in the stable structure obtained by the first principle calculation. Further, Table 1 also shows experimental values measured by actually forming a non-doped AlN film using a sputtering method and subjecting this AlN film to an X-ray diffraction method.

TABLE 1

| | Lattice Constant in a-Axis Direction (Å) | Lattice Constant in c-Axis Direction (Å) | c/a |
|---|---|---|---|
| Calculated Value | 3.13 | 5.02 | 1.60 |
| Experimental Value | 3.11 | 4.98 | 1.60 |

As shown in this Table, each calculated value has almost the same numerical value as the experimental value with the relative error of 1% or less. This result demonstrated that the simulation of the present embodiment was sufficiently reliable.

The following shows that, when aluminum nitride (AlN) is doped with magnesium (Mg) and the substituent element M (M represents any one of Cr, Mn, Fe, Co, Ni, Mo, Tc, Ru, Rh, Pd, Ag, W, Re, Os, Ir, Pt, and Au) together, the AlN can be doped with the more amount of the elements (Mg and the substituent element M) than if the AlN is doped with only the substituent element M.

Figure 1:
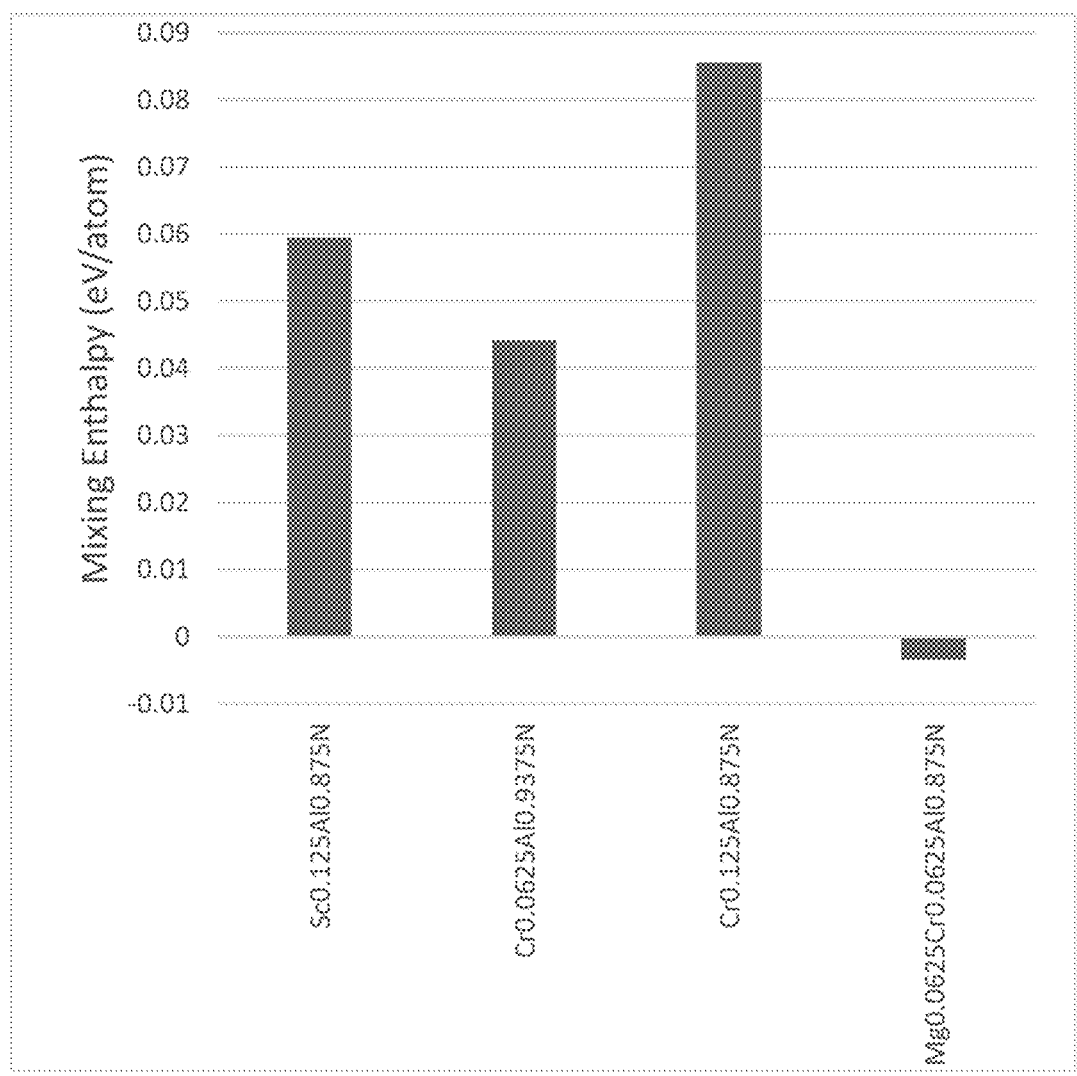
FIG. 1 is a graph showing values of the mixing enthalpy of $Al_{0.875}Mg_{0.0625}Cr_{0.0625}N$, $Al_{0.875}Sc_{0.125}N$, and $Al_{0.875}Cr_{0.125}N$.

As an example of this, FIG. 1 shows the mixing enthalpy of each of aluminum nitride ($Al_{0.875}Mg_{0.0625}Cr_{0.0625}N$) doped with Mg as well as Cr as the substituent element M, aluminum nitride ($Al_{0.875}Sc_{0.125}N$) doped with only Sc at the same concentration, and aluminum nitride ($Al_{0.875}Cr_{0.125}N$) doped with only Cr at the same concentration. Note that the mixing enthalpy ($\Delta H_{mixing}$) of each kind of aluminum nitride can be obtained by substituting each numerical value calculated by VASP in the following mathematical formula 1.

[Mathematical formula 1]
$$\Delta H_{mixing} = E_{total}^{Mg_{0.0625}Cr_{0.0625}Al_{0.875}N} - \frac{1}{16}E_{total}^{MgN} - \frac{1}{16}E_{total}^{CrN} \frac{14}{16}E_{total}^{AlN}$$

$E_{total}^{MgN}$: Total Energy of MgN with Wurtzite structure $E_{total}^{CrN}$: Total Energy of CrN with Wurtzite structure $E_{total}^{AlN}$: Total Energy of AlN with Wurtzite structure As is evident from this diagram, it is found that the mixing enthalpy of the AlN doped with Mg and Cr together is lower than the mixing enthalpy of the AlN doped with only Sc or Cr at the same concentration. That is, it is shown that dissolving the elements (Mg+Cr) in the AlN as a solid is more thermodynamically advantageous than dissolving Cr in the AlN as a solid, at the same concentration. This demonstrated that the AlN could be doped with the more amount (at higher concentrations) of the elements (Mg and Cr) than scandium.

Note that, in the present embodiment, the mixing enthalpy of the aluminum nitride ($Al_{0.875}Mg_{0.0625}Cr_{0.0625}N$) doped with Mg and Cr together has been described as an example. However, the mixing enthalpy of the aluminum nitride doped with Mg and the substituent element M other than Cr (excluding Re) together is also similarly lowered. Thus, the AlN can be doped with the more amount (at the higher concentrations) of the elements (Mg+the substituent element M (excluding Re)) than scandium.

Figure 2:
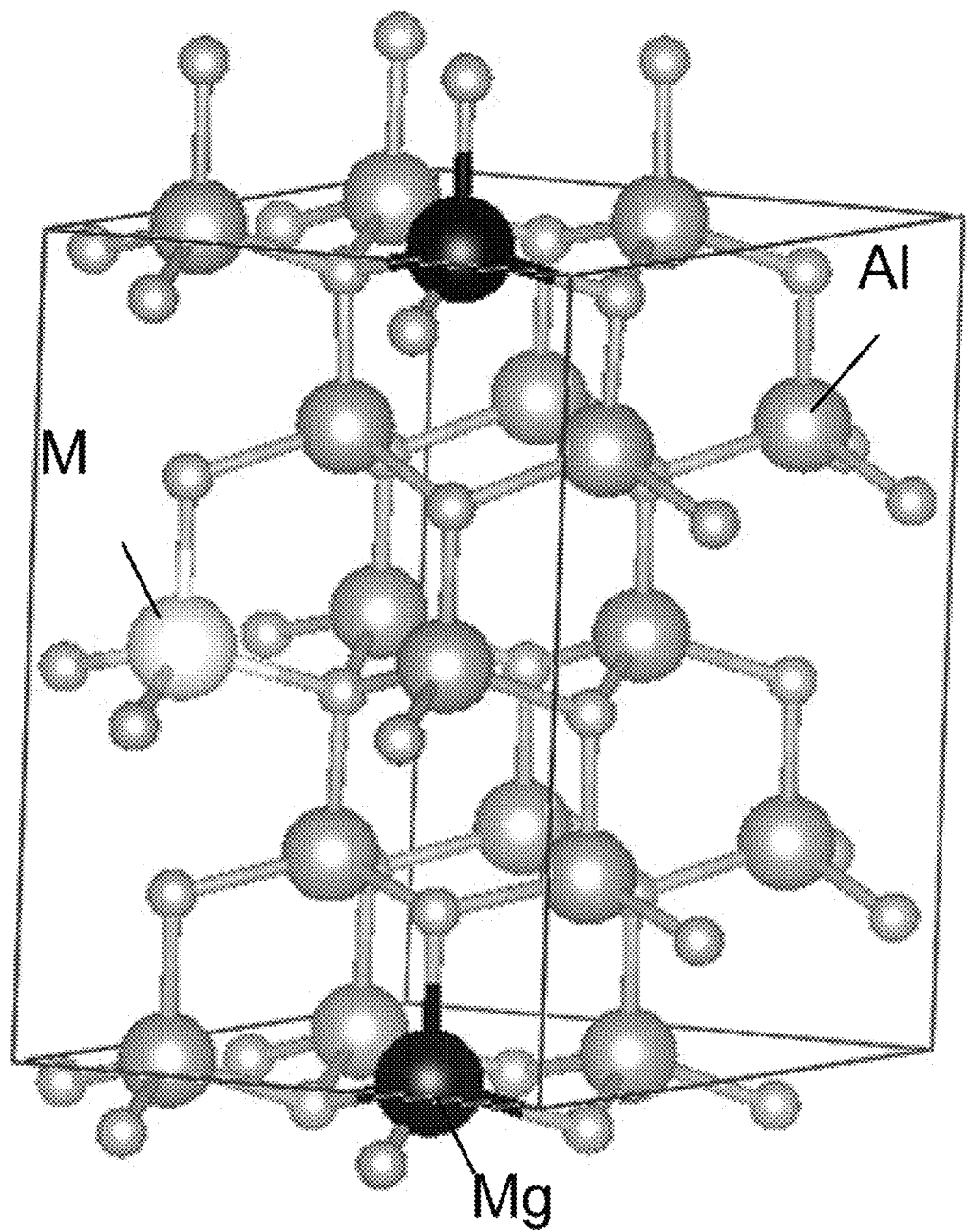
FIG. 2 is a diagram illustrating an example of a calculation model of doped AlN used for a simulation according to a first embodiment.

Next, a description will be given of a simulation using doped AlN in which aluminum nitride (AlN) is doped with magnesium (Mg) and the substituent element M together. FIG. 2 is a diagram illustrating an example of a crystal structure of the doped AlN in which the AlN is doped with magnesium and the substituent element M, used in the simulation according to the present embodiment.

As shown in this diagram, the crystal structure of this doped AlN forms a wurtzite crystal structure in which one Al atom is substituted with a Mg atom and one Al atom is substituted with an atom of the substituent element M in a unit lattice containing sixteen Al atoms and sixteen nitrogen atoms. Here, when the total of the number of Al atoms, the number of Mg atoms, and the number of atoms of the substituent element M is set to 1, the number of Mg atoms is defined as X and the number of atoms of the substituent element M is defined as Y. In such a case, in the doped AlN used in this simulation, both the concentration X of Mg atoms and the concentration Y of the substituent element M are given as 0.0625. Note that these kinds of doped AlN can be actually produced by the production method described in the aforementioned Non-Patent Literature 1.

In the present embodiment, chromium (Cr), manganese (Mn), iron (Fe), cobalt (Co), nickel (Ni), molybdenum (Mo), technetium (Tc), ruthenium (Ru), rhodium (Rh), palladium (pd), silver (Ag), tungsten (W), rhenium (Re), osmium (Os), iridium (Ir), platinum (Pt), and gold (Au) were used as the substituent element M.

As is the case with the non-doped AlN, the electronic state of these kinds of doped AlN and the AlN doped with only Sc in the stable structure can be calculated by the first principle calculation. Then, values of the lattice constant in the a-axis direction, the lattice constant in the c-axis direction, and the lattice constant ratio c/a can be calculated from the electronic state.

Then, a small strain is forcibly applied to each crystal lattice of the non-doped AlN, the AlN doped with only Sc, and the doped AlN in the stable structure. As a result, a small change in the total energy caused by this operation makes it possible to calculate each of the piezoelectric stress constant $e_{33}$, the elastic constant $C_{33}$, and the dielectric constant $\varepsilon_{33}$ of the non-doped AlN, the AlN doped with only Sc, and the doped AlN. That is, each of the piezoelectric stress constant $e_{33}$, the elastic constant $C_{33}$, and the dielectric constant $\varepsilon_{33}$ of the non-doped AlN, the AlN doped with only Sc, and the doped AlN can be calculated by using the first principle calculation.

Table 2 shows the lattice constant c, the lattice constant a, the lattice constant ratio c/a, the piezoelectric stress constant $e_{33}$, the elastic constant $C_{33}$, and the dielectric constant $\varepsilon_{33}$ of the non-doped AlN, the AlN doped with only Sc, and each kind of doped AlN thus obtained. Note that the higher numerical value of the piezoelectric stress constant $e_{33}$ indicates the higher performance index. On the other hand, the lower numerical value of the elastic constant $C_{33}$ indicates the higher performance index.

AlN calculated as above are each substituted in these relational expressions, it becomes possible to calculate each of the electromechanical coupling constant $k^2$, the piezoelectric charge constant $d_{33}$, and the piezoelectric voltage constant $g_{33}$ of the non-doped AlN, the AlN doped with only Sc, and the doped AlN. Note that the elastic constants $C_{11}$, $C_{12}$, and $C_{13}$, and the piezoelectric stress constant $e_{31}$ can be calculated in the same manner as the piezoelectric stress constant $e_{33}$ and the elastic constant $C_{33}$.

TABLE 2

| Chemical Formula | Lattice Constant c (Å) | Lattice Constant a (Å) | c/a | Piezoelectric Stress Constant $e_{33}$ (C/m$^2$) | Elastic Constant $C_{33}$ (GPa) | Dielectric Constant $\varepsilon_{33}$ (×10$^{-11}$ F/m) |
|---|---|---|---|---|---|---|
| AlN | 5.02 | 3.13 | 1.60 | 1.46 | 357.71 | 8.65 |
| $Sc_{0.125}Al_{0.875}N$ | 5.05 | 3.18 | 1.59 | 1.67 | 291.87 | 9.51 |
| $Mg_{0.0625}Cr_{0.0625}Al_{0.875}N$ | 5.02 | 3.15 | 1.59 | 1.65 | 308.52 | 10.13 |
| $Mg_{0.0625}Mn_{0.0625}Al_{0.875}N$ | 5.01 | 3.15 | 1.59 | 1.73 | 304.12 | 10.53 |
| $Mg_{0.0625}Fe_{0.0625}Al_{0.875}N$ | 5.01 | 3.16 | 1.59 | 1.82 | 253.29 | 34.10 |
| $Mg_{0.0625}Co_{0.0625}Al_{0.875}N$ | 5.01 | 3.15 | 1.59 | 1.68 | 306.31 | 11.77 |
| $Mg_{0.0625}Ni_{0.0625}Al_{0.875}N$ | 5.01 | 3.16 | 1.59 | 1.82 | 287.56 | 24.30 |
| $Mg_{0.0625}Cu_{0.0625}Al_{0.875}N$ | 5.03 | 3.16 | 1.59 | 1.25 | 163.12 | 61.95 |
| $Mg_{0.0625}Mo_{0.0625}Al_{0.875}N$ | 5.03 | 3.17 | 1.59 | 1.82 | 287.61 | 10.81 |
| $Mg_{0.0625}Tc_{0.0625}Al_{0.875}N$ | 5.03 | 3.16 | 1.59 | 1.94 | 284.36 | 10.86 |
| $Mg_{0.0625}Ru_{0.0625}Al_{0.875}N$ | 5.03 | 3.16 | 1.59 | 1.97 | 289.28 | 10.80 |
| $Mg_{0.0625}Rh_{0.0625}Al_{0.875}N$ | 5.02 | 3.17 | 1.59 | 2.02 | 284.73 | 11.11 |
| $Mg_{0.0625}Pd_{0.0625}Al_{0.875}N$ | 5.02 | 3.17 | 1.58 | 2.07 | 269.73 | 13.44 |
| $Mg_{0.0625}Ag_{0.0625}Al_{0.875}N$ | 5.06 | 3.17 | 1.60 | 1.86 | 259.65 | 41.18 |
| $Mg_{0.0625}W_{0.0625}Al_{0.875}N$ | 5.02 | 3.17 | 1.58 | 1.74 | 289.11 | 10.77 |
| $Mg_{0.0625}Re_{0.0625}Al_{0.875}N$ | 5.02 | 3.17 | 1.58 | 1.87 | 282.77 | 10.75 |
| $Mg_{0.0625}Os_{0.0625}Al_{0.875}N$ | 5.02 | 3.17 | 1.58 | 1.95 | 283.77 | 10.67 |
| $Mg_{0.0625}Al_{0.0625}Al_{0.875}N$ | 5.01 | 3.17 | 1.58 | 2.14 | 276.10 | 10.96 |
| $Mg_{0.0625}Pt_{0.0625}Al_{0.875}N$ | 5.01 | 3.18 | 1.58 | 2.27 | 262.96 | 12.23 |
| $Mg_{0.0625}Au_{0.0625}Al_{0.875}N$ | 5.06 | 3.18 | 1.59 | 2.54 | 251.22 | 24.82 |

Figure 3:
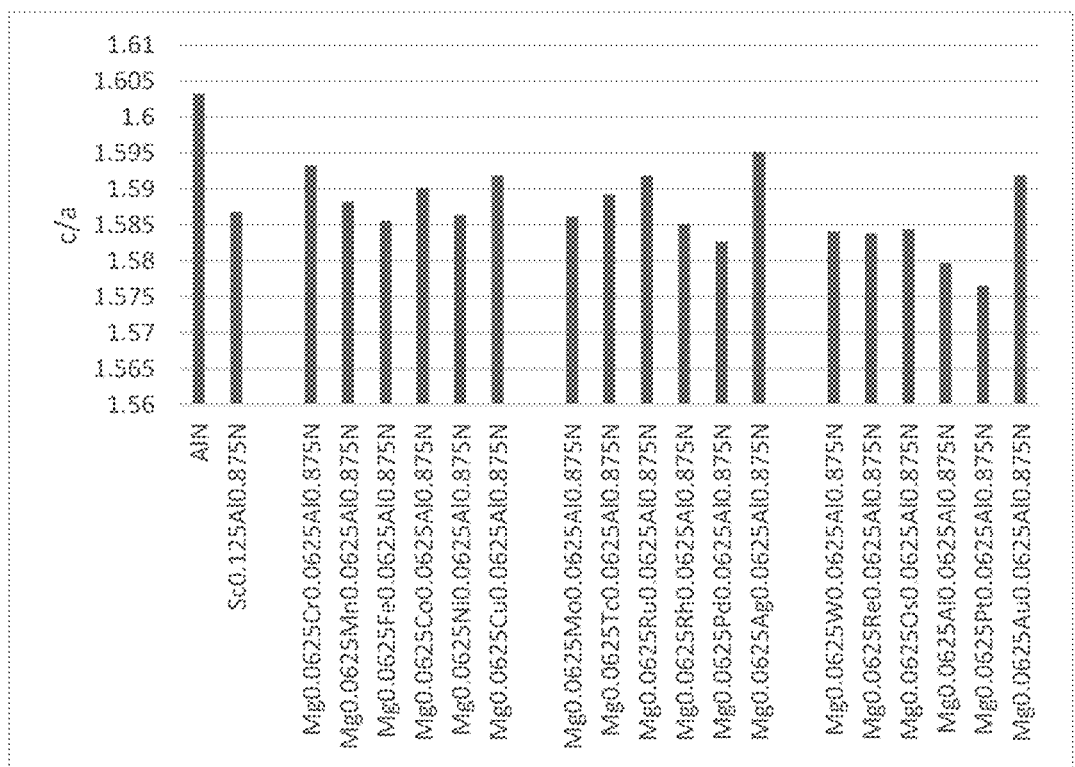
Figure 4:
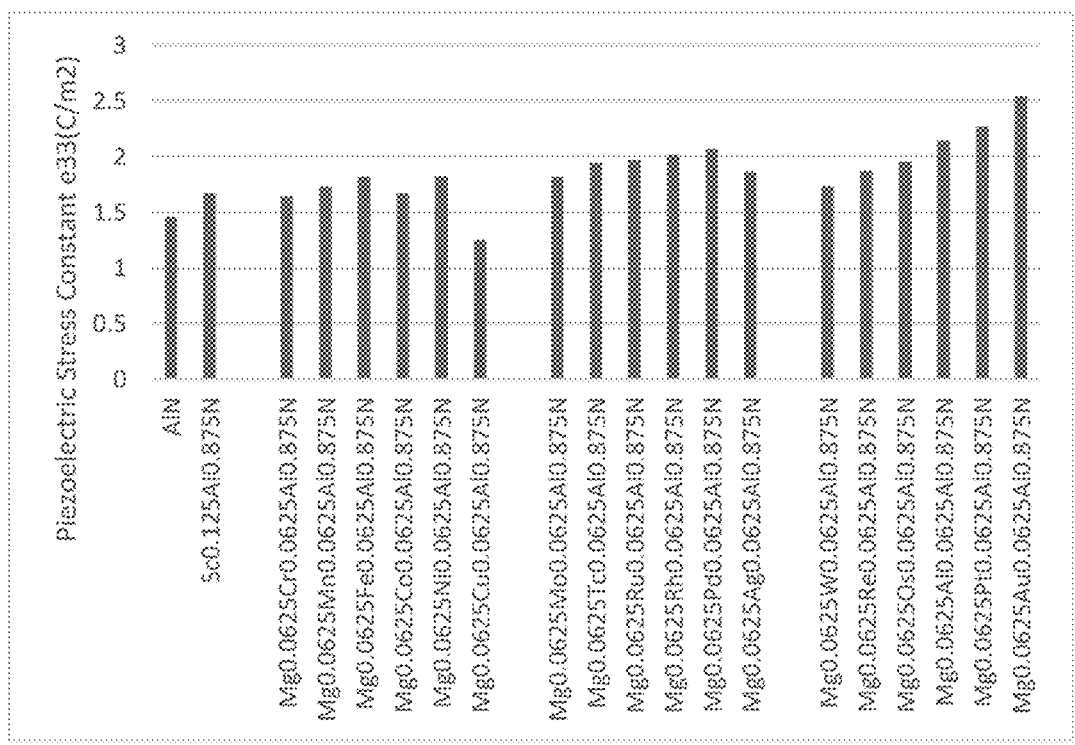
FIG. 4 is a graph showing the relation between non-doped AlN, AlN doped with only Sc, and each kind of doped AlN, and the piezoelectric stress constant $e_{33}$.
Figure 5:
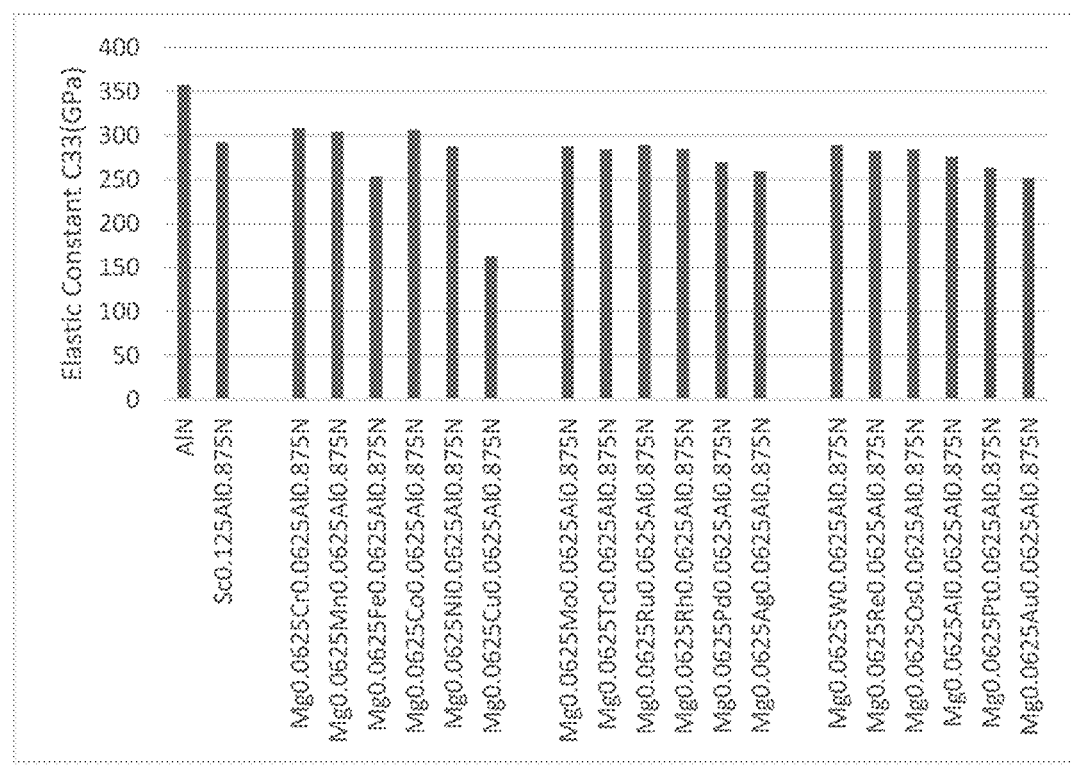
FIG. 5 is a graph showing the relation between non-doped AlN, AlN doped with only Sc, and each kind of doped AlN, and the elastic constant $C_{33}$.

Further, FIG. 3 is a graph showing the relation between the non-doped AlN, the AlN doped with only Sc, and each kind of doped AlN, and the lattice constant ratio c/a. FIG. 4 is a graph showing the relation between the non-doped AlN, the AlN doped with only Sc, and each kind of doped AlN, and the piezoelectric stress constant $e_{33}$. FIG. 5 is a graph showing the relation between the non-doped AlN, the AlN doped with only Sc, and each kind of doped AlN, and the elastic constant $C_{33}$.

On the other hand, the following relational expression of mathematical formula 2 holds between the piezoelectric stress constant $e_{33}$, the elastic constant $C_{33}$, and the dielectric constant $\varepsilon_{33}$ in the c-axis direction, and the electromechanical coupling constant $k^2$. Further, each of the following relational expressions of mathematical formula 3 holds between the piezoelectric charge constant $d_{33}$, the piezoelectric stress constant $e_{33}$, and the elastic constant $C_{33}$. Thus, when the piezoelectric charge constant $e_{33}$, the elastic constant $C_{33}$, the dielectric constant $\varepsilon_{33}$, and the like of the non-doped AlN, the AlN doped with only Sc, and the doped $$k^2 = \frac{e_{33}^2}{\varepsilon_{33} \times c_{33}} \qquad \text{[Mathematical formula 2]}$$

$$d_{33} = \frac{e_{33}(C_{11} + C_{12}) - 2e_{31}C_{13}}{(C_{11} + C_{12})C_{33} - 2C_{13}^2} \qquad \text{[Mathematical formula 3]}$$

$$g_{33} = \frac{d_{33}}{\varepsilon_{33}}$$

Next, Table 3 shows the mixing enthalpy, the electromechanical coupling constant $k^2$, the piezoelectric charge constant $d_{33}$, and the piezoelectric voltage constant $g_{33}$ of the non-doped AlN, the AlN doped with only Sc, and each kind of doped AlN thus obtained. Note that the higher numerical values of the electromechanical coupling value $k^2$, the piezoelectric charge constant $d_{33}$, and the piezoelectric voltage constant $g_{33}$ indicate the higher performance indexes.

TABLE 3

| Chemical Formula | Mixing Enthalpy (eV/atom) | Electromechanical Coupling Constant $k^2$ (%) | Piezoelectric Charge Constant $d_{33}$ (pC/N) | Piezoelectric Voltage Constant $g_{33}$ (m$^2$/C) |
|---|---|---|---|---|
| AlN | | 6.90 | 5.28 | 0.061 |
| $Sc_{0.125}Al_{0.875}N$ | 0.0595 | 10.08 | 8.32 | 0.087 |
| $Mg_{0.0625}Cr_{0.0625}Al_{0.875}N$ | −0.0034 | 8.71 | 7.18 | 0.071 |

TABLE 3-continued

| Chemical Formula | Mixing Enthalpy (eV/atom) | Electromechanical Coupling Constant $k^2$ (%) | Piezoelectric Charge Constant $d_{33}$ (pC/N) | Piezoelectric Voltage Constant $g_{33}$ (m²/C) |
|---|---|---|---|---|
| $Mg_{0.0625}Mn_{0.0625}Al_{0.875}N$ | 0.0110 | 9.33 | 7.69 | 0.073 |
| $Mg_{0.0625}Fe_{0.0625}Al_{0.875}N$ | 0.0323 | 3.83 | 9.78 | 0.029 |
| $Mg_{0.0625}Co_{0.0625}Al_{0.875}N$ | 0.0503 | 7.78 | 7.30 | 0.062 |
| $Mg_{0.0625}Ni_{0.0625}Al_{0.875}N$ | 0.0507 | 4.76 | 8.75 | 0.036 |
| $Mg_{0.0625}Cu_{0.0625}Al_{0.875}N$ | 0.0437 | 1.55 | 7.63 | 0.012 |
| $Mg_{0.0625}Mo_{0.0625}Al_{0.875}N$ | 0.0352 | 10.62 | 8.59 | 0.079 |
| $Mg_{0.0625}Tc_{0.0625}Al_{0.875}N$ | 0.0387 | 12.23 | 9.23 | 0.085 |
| $Mg_{0.0625}Ru_{0.0625}Al_{0.875}N$ | 0.0457 | 12.42 | 9.19 | 0.085 |
| $Mg_{0.0625}Rh_{0.0625}Al_{0.875}N$ | 0.0519 | 12.90 | 9.65 | 0.087 |
| $Mg_{0.0625}Pd_{0.0625}Al_{0.875}N$ | 0.0498 | 11.81 | 10.95 | 0.082 |
| $Mg_{0.0625}Ag_{0.0625}Al_{0.875}N$ | 0.0471 | 3.24 | 11.23 | 0.027 |
| $Mg_{0.0625}W_{0.0625}Al_{0.875}N$ | 0.0451 | 9.70 | 8.51 | 0.079 |
| $Mg_{0.0625}Re_{0.0625}Al_{0.875}N$ | 0.0652 | 11.54 | 9.12 | 0.085 |
| $Mg_{0.0625}Os_{0.0625}Al_{0.875}N$ | 0.0451 | 12.59 | 8.98 | 0.084 |
| $Mg_{0.0625}Ir_{0.0625}Al_{0.875}N$ | 0.0504 | 15.15 | 10.42 | 0.095 |
| $Mg_{0.0625}Pt_{0.0625}Al_{0.875}N$ | 0.0489 | 16.08 | 12.63 | 0.103 |
| $Mg_{0.0625}Au_{0.0625}Al_{0.875}N$ | 0.0485 | 10.39 | 17.11 | 0.069 |

Figure 6:
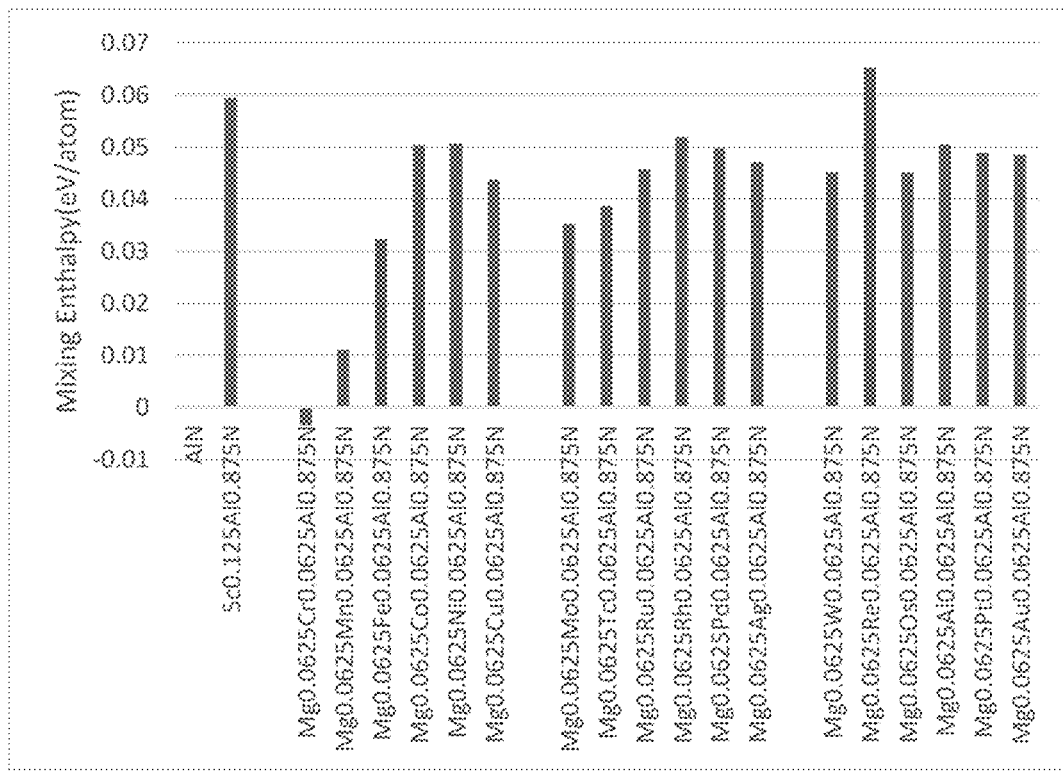
FIG. 6 is a graph showing the relation between non-doped AlN, AlN doped with only Sc, and each kind of doped AlN, and the mixing enthalpy.
Figure 7:
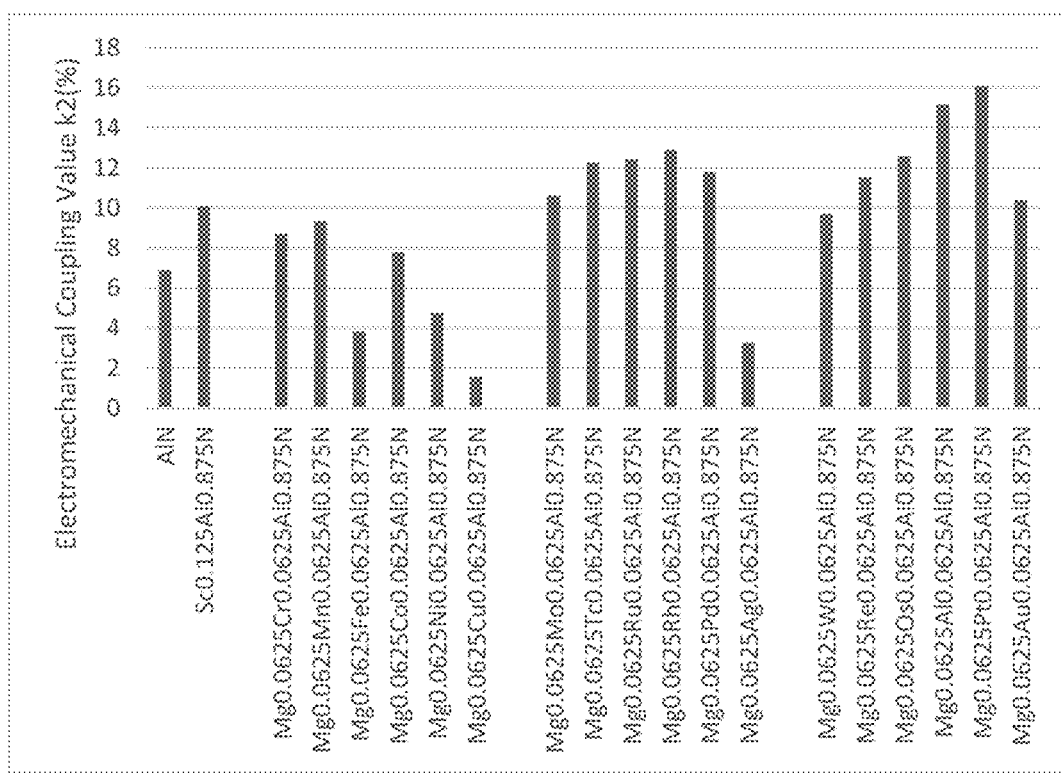
FIG. 7 is a graph showing the relation between non-doped AlN, AlN doped with only Sc, and each kind of doped AlN, and the electromechanical coupling constant $k^2$.
Figure 8:
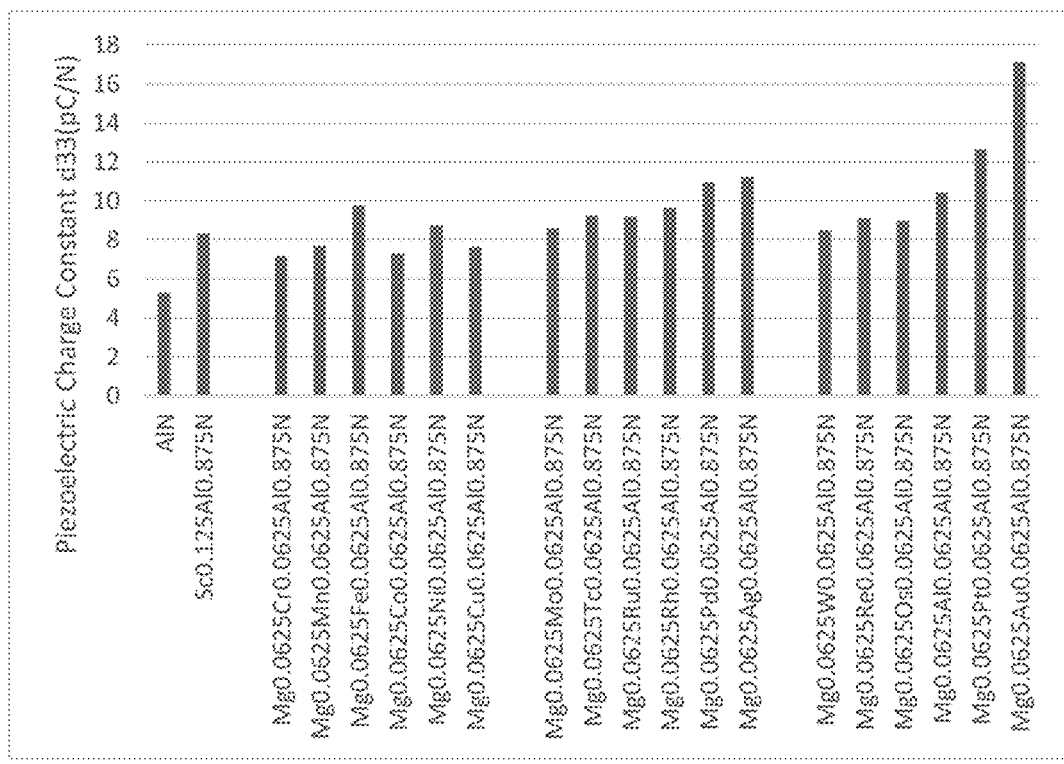
FIG. 8 is a graph showing the relation between non-doped AlN, AlN doped with only Sc, and each kind of doped AlN, and the piezoelectric charge constant $d_{33}$.
Figure 9:
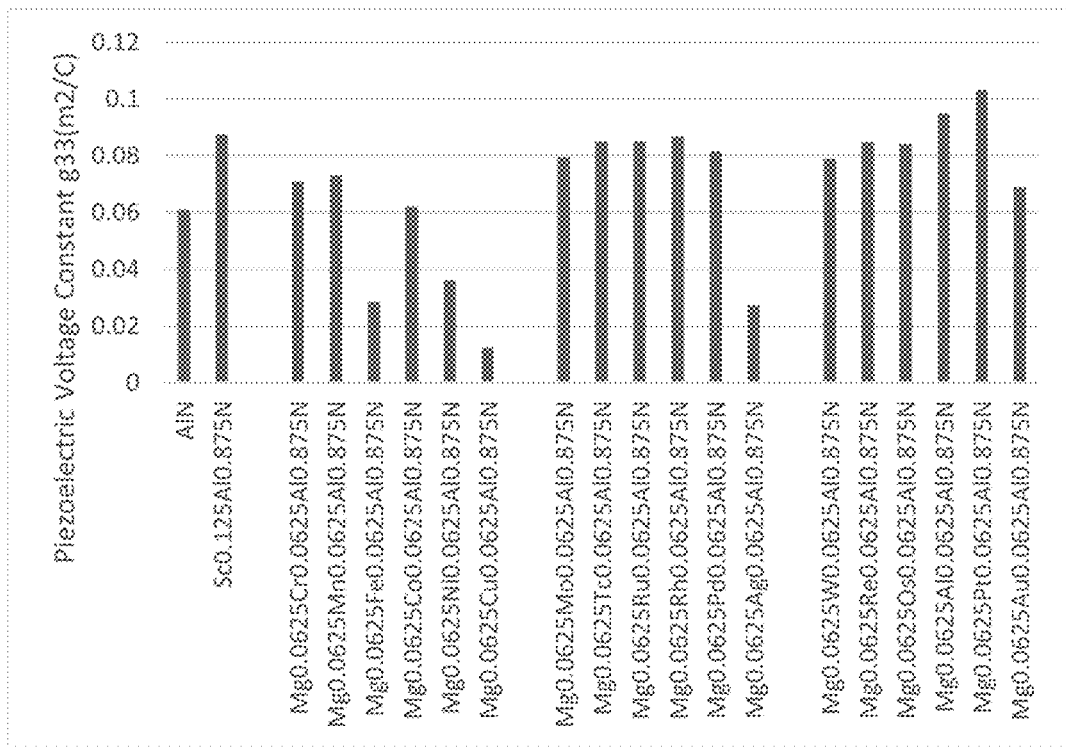
FIG. 9 is a graph showing the relation between non-doped AlN, AlN doped with only Sc, and each kind of doped AlN, and the piezoelectric voltage constant $g_{33}$.

Further, FIG. 6 is a graph showing the relation between the non-doped AlN, the AlN doped with only Sc, and each kind of doped AlN, and the mixing enthalpy. FIG. 7 is a graph showing the relation between the non-doped AlN, the AlN doped with only Sc, and each kind of doped AlN, and the electromechanical coupling value $k^2$. FIG. 8 is a graph showing the relation between the non-doped AlN, the AlN doped with only Sc, and each kind of doped AlN, and the piezoelectric charge constant $d_{33}$. FIG. 9 is a graph showing the relation between the non-doped AlN, the AlN doped with only Sc, and each kind of doped AlN, and the piezoelectric voltage constant $g_{33}$.

Further, the piezoelectric charge constant $d_{33}$, the piezoelectric stress constant $e_{33}$, and the elastic constant $C_{33}$ of the doped AlN different from those described in Table 3 were calculated using the same method as described above. The results are shown in Table 4.

TABLE 4

| Chemical Formula | Piezoelectric Charge Constant $d_{33}$ (pC/N) | Piezoelectric Stress Constant $e_{33}$ (C/m²) | Elastic Constant $C_{33}$ (GPa) |
|---|---|---|---|
| $Mg_{0.1875}Cr_{0.1875}Al_{0.625}N$ | 12.16 | 2.11 | 257.71 |
| $Mg_{0.25}Cr_{0.25}Al_{0.5}N$ | 7.81 | 2.17 | 303.66 |
| $Mg_{0.1875}Mn_{0.1875}Al_{0.625}N$ | 65.06 | 4.30 | 222.13 |
| $Mg_{0.25}Mn_{0.25}Al_{0.5}N$ | 6.67 | 1.09 | 304.58 |
| $Mg_{0.1875}Fe_{0.1875}Al_{0.625}N$ | 8.61 | 1.63 | 165.46 |
| $Mg_{0.25}Fe_{0.25}Al_{0.5}N$ | 11.34 | 0.64 | 135.08 |
| $Mg_{0.1875}Mo_{0.1875}Al_{0.625}N$ | 23.07 | 2.85 | 218.61 |
| $Mg_{0.25}Mo_{0.25}Al_{0.5}N$ | 28.92 | 2.51 | 189.92 |
| $Mg_{0.325}Mo_{0.325}Al_{0.35}N$ | 8.13 | 0.95 | 272.49 |
| $Mg_{0.25}Tc_{0.25}Al_{0.5}N$ | 63.01 | 4.65 | 186.41 |
| $Mg_{0.325}Tc_{0.325}Al_{0.35}N$ | 39.66 | 2.75 | 153.82 |
| $Mg_{0.1875}Ru_{0.1875}Al_{0.625}N$ | 21.55 | 4.30 | 244.65 |
| $Mg_{0.25}Ru_{0.25}Al_{0.5}N$ | 13.09 | 0.93 | 228.20 |
| $Mg_{0.325}Ru_{0.325}Al_{0.35}N$ | 6.79 | 1.00 | 192.05 |
| $Mg_{0.1875}Rh_{0.1875}Al_{0.625}N$ | 11.18 | 1.32 | 226.19 |
| $Mg_{0.25}Rh_{0.25}Al_{0.5}N$ | 42.19 | 2.86 | 152.70 |
| $Mg_{0.325}Rh_{0.325}Al_{0.35}N$ | 41.75 | 2.91 | 152.62 |
| $Mg_{0.1875}Pd_{0.1875}Al_{0.625}N$ | 31.92 | 3.37 | 198.10 |
| $Mg_{0.25}Pd_{0.25}Al_{0.5}N$ | 57.69 | 5.28 | 161.45 |
| $Mg_{0.325}Pd_{0.325}Al_{0.35}N$ | 47.32 | 4.13 | 157.13 |
| $Mg_{0.1875}Ag_{0.1875}Al_{0.625}N$ | 52.73 | 3.26 | 173.04 |
| $Mg_{0.25}Ag_{0.25}Al_{0.5}N$ | 40.89 | 2.08 | 163.33 |
| $Mg_{0.1875}W_{0.1875}Al_{0.625}N$ | 25.38 | 3.00 | 210.48 |
| $Mg_{0.25}W_{0.25}Al_{0.5}N$ | 53.29 | 3.71 | 159.79 |
| $Mg_{0.325}W_{0.325}Al_{0.35}N$ | 9.75 | 1.55 | 299.10 |
| $Mg_{0.1875}Re_{0.1875}Al_{0.625}N$ | 11.89 | 1.80 | 244.66 |
| $Mg_{0.25}Re_{0.25}Al_{0.5}N$ | 13.49 | 1.20 | 190.94 |
| $Mg_{0.325}Re_{0.325}Al_{0.35}N$ | 13.54 | 0.49 | 175.59 |
| $Mg_{0.1875}Os_{0.1875}Al_{0.625}N$ | 13.20 | 2.01 | 244.86 |
| $Mg_{0.25}Os_{0.25}Al_{0.5}N$ | 14.14 | 1.86 | 245.42 |
| $Mg_{0.325}Os_{0.325}Al_{0.35}N$ | 9.82 | 0.42 | 212.68 |
| $Mg_{0.1875}Ir_{0.1875}Al_{0.625}N$ | 12.34 | 1.99 | 255.46 |
| $Mg_{0.325}Ir_{0.325}Al_{0.35}N$ | 41.44 | 3.09 | 166.23 |
| $Mg_{0.1875}Pt_{0.1875}Al_{0.625}N$ | 5.67 | 1.37 | 255.46 |
| $Mg_{0.25}Pt_{0.25}Al_{0.5}N$ | 14.78 | 2.09 | 227.20 |
| $Mg_{0.325}Pt_{0.325}Al_{0.35}N$ | 31.34 | 2.65 | 186.51 |
| $Mg_{0.1875}Au_{0.1875}Al_{0.625}N$ | 23.14 | 2.16 | 183.97 |
| $Mg_{0.25}Au_{0.25}Al_{0.5}N$ | 24.64 | 2.64 | 195.68 |
| $Mg_{0.325}Au_{0.325}Al_{0.35}N$ | 47.80 | 2.43 | 140.67 |

These results demonstrated that the AlN doped with Mg and any one of Cr, Mn, Fe, Co, Ni, Mo, Tc, Ru, Rh, Pd, Ag, W, Re, Os, Ir, Pt, and Au together showed a value indicating the higher performance index (at least any one of $d_{33}$, $e_{33}$, $C_{33}$, $g_{33}$, and $k^2$) than the AlN not doped with any atom.

Furthermore, these piezoelectric bodies exhibiting the high performance index have low losses and can be operated in a wide band. Thus, using these piezoelectric bodies makes it possible to provide a MEMS device which can further contribute to the operation at high frequencies and the reduction in size and power consumption of portable devices.

Note that the present embodiment has been described using an example in which the piezoelectric body represented by the chemical formula $Al_{1-X-Y}Mg_XM_YN$ has a value of X as 0.0625 and Y as 0.0625. However, the present invention is not limited thereto, and it only requires that X+Y is less than 1, X is in a range of more than 0 and less than 1, and Y is in a range of more than 0 and less than 1.

Figure 10:
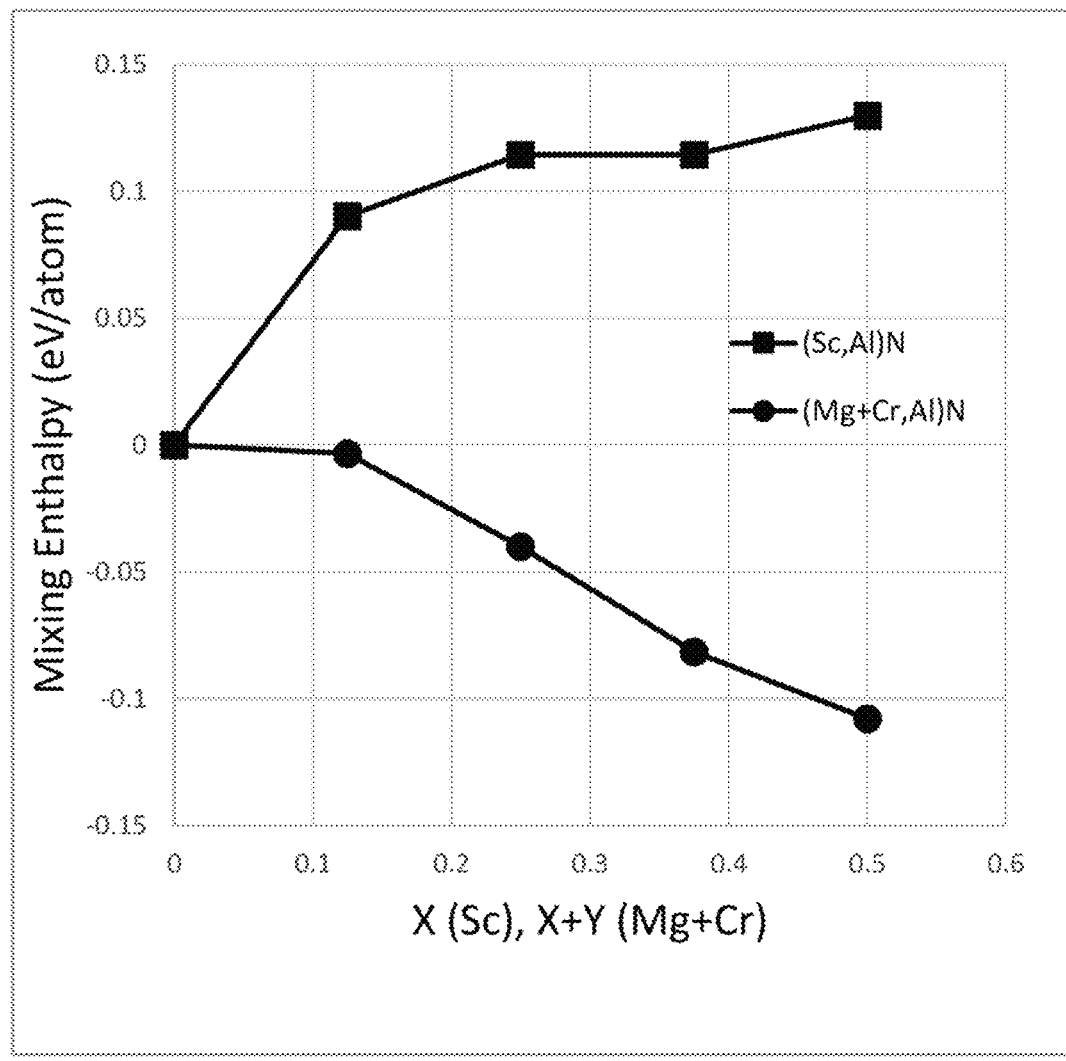
FIG. 10 is a graph showing the relation between concentrations X(Sc) and X+Y (Mg+Cr), and the mixing enthalpy of the piezoelectric bodies.

Further, it is preferable that, regarding these variables X and Y, X+Y is 0.65 or less, X is in a range of more than 0 and less than 0.65, and Y is in a range of more than 0 and less than 0.65. Having the variables within these ranges allows the piezoelectric body to be reliably produced. For example, as shown in FIG. 10, in the piezoelectric body doped with Cr as the substituent element M (Mg and Cr are doped at the same concentration (mol %)), the higher concentration X+Y causes a further reduction in the mixing enthalpy. On the other hand, in the piezoelectric body doped with Sc, the higher concentration X causes a further increase in the mixing enthalpy. This shows that the piezoelectric body doped with Mg and Cr together can be more easily produced than the piezoelectric body doped with Sc at the same concentration.

Figure 11:
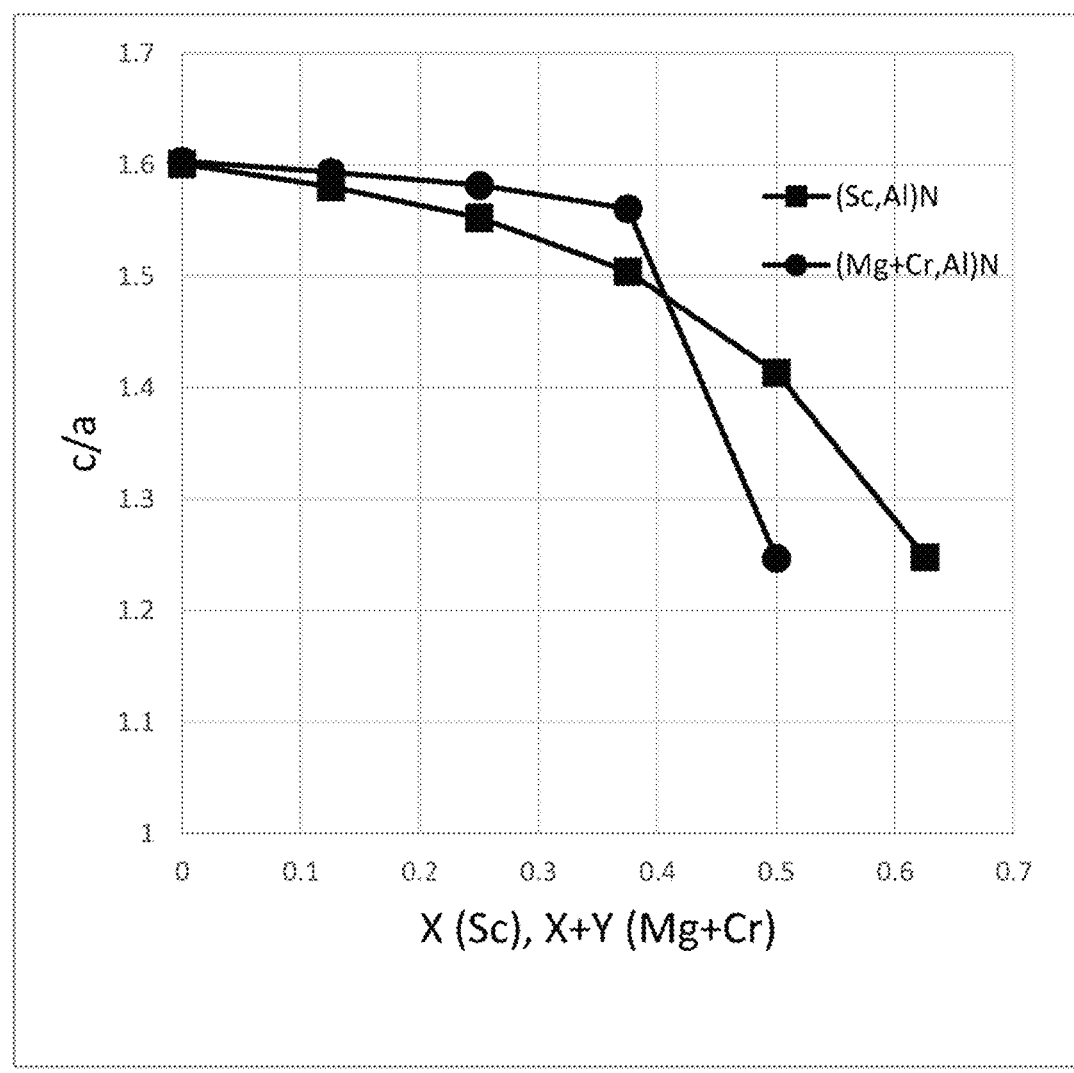
FIG. 11 is a graph showing the relation between concentrations X(Sc) and X+Y (Mg+Cr), and the lattice constant ratio c/a of the piezoelectric bodies.

Next, FIG. 11 shows the relation between the concentration X+Y (Mg and Cr are doped at the same concentration (mol %)) and the lattice constant ratio c/a of the piezoelectric body. As is evident from this drawing, it is shown that, in the piezoelectric body doped with Mg and Cr together, as is the case with the piezoelectric body doped with Sc, the higher value of X+Y (X in the case of Sc) causes a further reduction in the lattice constant ratio c/a.

Figure 12:
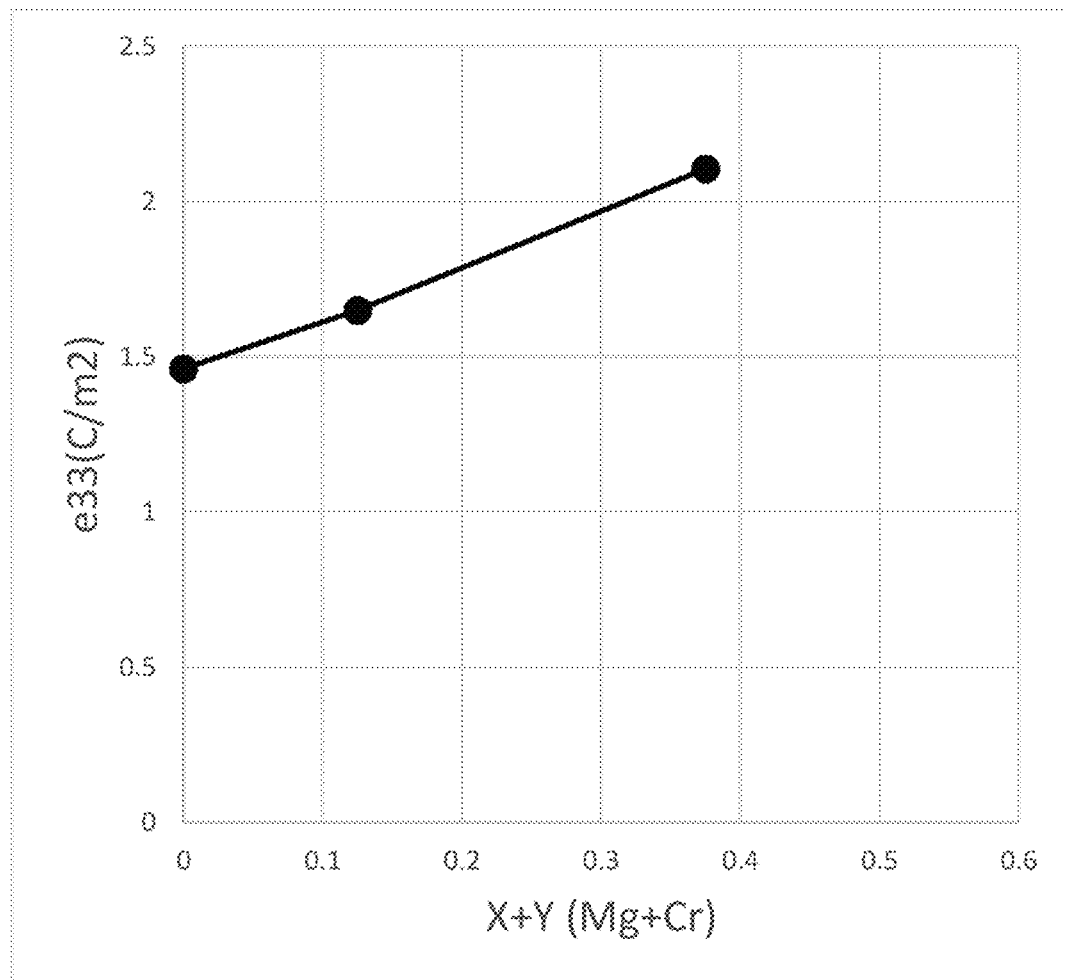
FIG. 12 is a graph showing the relation between a concentration X+Y (Mg+Cr) and the piezoelectric stress constant $e_{33}$ of the piezoelectric bodies.

Further, FIG. 12 shows the relation between the concentration X+Y (Mg and Cr are doped at the same concentration (mol %)) and the piezoelectric stress constant $e_{33}$ of the piezoelectric body. As is evident from this drawing, it is shown that, in the piezoelectric body doped with Mg and Cr together, the higher value of X+Y causes a further increase in the piezoelectric stress constant $e_{33}$.

Further, it is more preferable that, regarding these variables X and Y, X+Y is 0.375 or less, X is in a range of more than 0 and 0.1875 or less, and Y is in a range of more than 0 and 0.1875 or less.

Further, it is particularly preferable that, regarding these variables X and Y, X+Y is 0.125 or less, X is in a range of more than 0 and 0.0625 or less, and Y is in a range of more than 0 and 0.0625 or less.

The invention claimed is:

1. A nitride material represented by a chemical formula $$Al_{1-X-Y}Mg_XM_YN$$

where X+Y is less than 1,
X is in a range of more than 0 and less than 1, and
Y is in a range of more than 0 and less than 1, and wherein M represents any one of Cr, Mn, Fe, Co, Ni, Mo, Tc, Ru, Rh, Pd, Ag, W, Re, Os, Ir, Pt, and Au.

2. The nitride material according to claim 1, wherein X+Y is 0.65 or less, X is in a range of more than 0 and less than 0.65, and Y is in a range of more than 0 and less than 0.65.

3. The nitride material according to claim 1, wherein X+Y is 0.375 or less, X is in a range of more than 0 and 0.1875 or less, and Y is in a range of more than 0 and 0.1875 or less.

4. The nitride material according to claim 1, wherein X+Y is 0.125 or less, X is in a range of more than 0 and 0.0625 or less, and Y is in a range of more than 0 and 0.0625 or less.

5. The nitride material according to claim 1, wherein M is any one of Cr, Mn, Fe, Co, Ni, Mo, Tc, Ru, Rh, Pd, Ag, W, Os, Ir, Pt, and Au.

6. The nitride material according to claim 1, wherein M is Cr or Mn.

7. A piezoelectric body comprising the nitride material according to claim 1.

8. A MEMS device using the piezoelectric body according to claim 7.

* * * * *